(12) United States Patent
Kim et al.

(10) Patent No.: US 7,826,293 B2
(45) Date of Patent: Nov. 2, 2010

(54) DEVICES AND METHODS FOR A THRESHOLD VOLTAGE DIFFERENCE COMPENSATED SENSE AMPLIFIER

(75) Inventors: Tae Kim, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 359 days.

(21) Appl. No.: 11/986,333

(22) Filed: Nov. 20, 2007

(65) Prior Publication Data

US 2009/0129188 A1    May 21, 2009

(51) Int. Cl.
*G11C 7/00* (2006.01)
(52) U.S. Cl. .................. 365/205; 365/206; 365/207; 365/210.12
(58) Field of Classification Search .............. 365/205, 365/206, 207, 210.12
See application file for complete search history.

(56) References Cited

U.S. PATENT DOCUMENTS

| | | | |
|---|---|---|---|
| 5,557,234 A | 9/1996 | Collins | 327/563 |
| 5,614,856 A * | 3/1997 | Wilson et al. | 327/170 |
| 5,650,970 A * | 7/1997 | Kai | 365/203 |
| 5,872,482 A | 2/1999 | Krauss | 327/561 |
| 6,181,621 B1 | 1/2001 | Lovett | 365/205 |
| 6,518,827 B1 | 2/2003 | Fifield et al. | 327/534 |
| 6,566,914 B2 | 5/2003 | Bruneau et al. | 327/55 |
| 6,728,152 B2 * | 4/2004 | Van De Graaff | 365/205 |
| 6,754,121 B2 * | 6/2004 | Worley | 365/207 |

OTHER PUBLICATIONS

Shunichi Suzuki and Masaki Hirata., "*Threshold Difference Compensated Sense Amplifier*", IEEE Journal of Solid-State Circuits, vol. SC-14, No. 6 Dec. 1979, pp. 1066-1070.
Yohji Watanabe et al. "*Offset Compensating Bit-Line Sensing Scheme for High Density DRAMS's*", IEEE Journal of Solid-State Circuits, vol. 29, No. 1, Jan. 1994, pp. 9-13.
Sanghoon Hong et al. "*Low-Voltage DRAM Sensing Scheme With Offset-Cancellation Sense Amplifier*", IEEE Journal of Solid-State Circuits, vol. 37, No. 10, Oct. 2002, pp. 1356-1360.

* cited by examiner

*Primary Examiner*—Pho M Luu
(74) *Attorney, Agent, or Firm*—Dorsey & Whitney LLP

(57) ABSTRACT

A voltage compensated sense amplifier includes a pair of digit line nodes respectively coupled to a pair of transistors. A first pair of switches are adapted to cross-couple the gates of the transistors to the respective digit line node and a second pair of switches are adapted to couple the gates of the transistors to a voltage supply. The first and second pair of switches are coupled to respective gates of the transistors independent of the pair of transistors being respectively coupled to the digit line nodes.

25 Claims, 6 Drawing Sheets

DEVICES AND METHODS FOR A THRESHOLD VOLTAGE DIFFERENCE COMPENSATED SENSE AMPLIFIER

TECHNICAL FIELD

Embodiments of the present invention relate generally to integrated memory devices, and more specifically, to a sense amplifier that compensates for threshold voltage differences in the transistors of the sense amplifier.

BACKGROUND

Memory devices are structured to have one or more arrays of memory cells that are arranged in rows and columns. Each memory cell stores data as an electrical charge that is accessed by a digit line associated with the memory cell. A charged memory cell, when the memory cell is selected, causes a positive change in voltage on the associated digit line, and a selected memory cell that is not charged causes a negative change in voltage on the associated digit line. The change in voltage on the digit line may be amplified and detected by a sense amplifier to indicate the value of the data bit stored in the memory cell.

Conventional sense amplifiers are typically coupled to a pair of complementary digit lines to which a large number of memory cells (not shown) are connected. Sense amplifiers typically improve the accuracy of determining the state of the selected memory cells. As known in the art, when memory cells are accessed, a row of memory cells are activated and sense amplifiers are used to amplify cell data for the respective column of activated memory cells by coupling each of the digit lines of the selected column to voltage supplies such that the digit lines have complementary logic levels. Each sense amplifier typically includes a pair of cross-coupled NMOS transistors and a pair of cross-coupled PMOS transistors coupled to the digit lines. The sources of the NMOS transistors are coupled to a common node, which during operation receives an NMOS activation signal RNL_. Similarly, the sources of the PMOS transistors are also coupled to a common node that receives a complementary activation signal ACT. The RNL_ signal is typically provided by ground or a negative supply voltage and the ACT signal is typically provided by a power supply voltage. When a memory cell is accessed, the voltage of one of the digit lines increases or decreases slightly, depending on whether the memory cell coupled to the digit line is charged or not, resulting in a voltage differential between the digit lines. While the voltage of one digit line increases or decreases slightly, the other digit line does not and serves as a reference for the sensing operation. Respective transistors are enabled due to the voltage differential, thereby coupling the slightly higher voltage digit line to the ACT node and the other digit line to the RNL_ node to further drive each of the digit lines in opposite directions and amplify the selected digit line signal.

The digit lines are equilibrated during a precharge period, such as to $V_{cc}/2$, so that a voltage differential can be accurately detected during a subsequent sensing operation. However, due to random threshold voltage mismatch of transistor components, the digit lines may be abruptly imbalanced before a voltage change is detected on one of the digit lines. Such threshold voltage deviations can cause the sense amplifier to erroneously amplify input signals in the wrong direction. A portion of a prior art threshold voltage compensated sense amplifier 100 is shown in FIG. 1. The sense amplifier 100 is shown with complimentary digit lines D and D_ coupled to sense nodes 112, 114, respectively. Capacitors 110 are coupled to respective digit lines D and D_ to represent digit line capacitance. The sense amplifier 100 additionally includes a pair of cross-coupled NMOS transistors 116, 118 whose source terminals are coupled to receive an RNL_ activation signal at a common node. The gates of the transistors 116, 118 are coupled to respective drain terminals through switches 120A,B in a diode configuration. The drain terminals of the transistors 116, 118 are additionally coupled to sense nodes 112, 114 through respective switches 121A, B.

During the precharge period, the switches 120A,B are initially disabled and the switches 121 A,B are enabled to place the sense amplifier 100 in a normal cross-coupled (latch) configuration, and the sense nodes 112, 114 and the RNL_ node are initially precharged and equilibrated to $V_{cc}/2$. While in this compensation period, the RNL_ node is next coupled to ground and the switches 120A,B are enabled while the switches 121A,B are disabled to place the transistors 116, 118 in a diode-coupled configuration. The voltage at sense node 112, which is cross-coupled to the gate and drain of the transistor 118 is set to a voltage equal to a threshold voltage $V_{TN0}$ of the transistor 118, since the voltage across the transistor 118 is equal to its threshold voltage. Similarly, the voltage at sense node 114 is set to a voltage equal to a threshold voltage $V_{TN1}$ of the transistor 116. The switches 120A,B are then disabled and the switches 121A,B are enabled such that the transistors 116, 118 are again placed in a normal latch configuration before the sensing operation begins. Therefore, any offset due to mismatches in transistor parameters of the transistors 116, 118 are compensated for by the voltage differential between sense nodes 112, 114 before sensing occurs.

Although the prior art sense amplifier 100 reduces threshold voltage mismatches between the NMOS transistors 116, 118, the switches 121A,B which are directly in the sensing path between the sense nodes 112, 114 and the transistors 116, 118, can negatively affect performance due to mismatches between the switches 121A,B. That is, by placing additional components on the sensing path may cause further digit line offsets as a result of mismatched switch components 120A,B. Additionally, the switches 121A,B may reduce sensing gain of the sense amplifier 100.

There is, therefore, a need for an alternative sense amplifier design that reduces threshold voltage mismatches.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
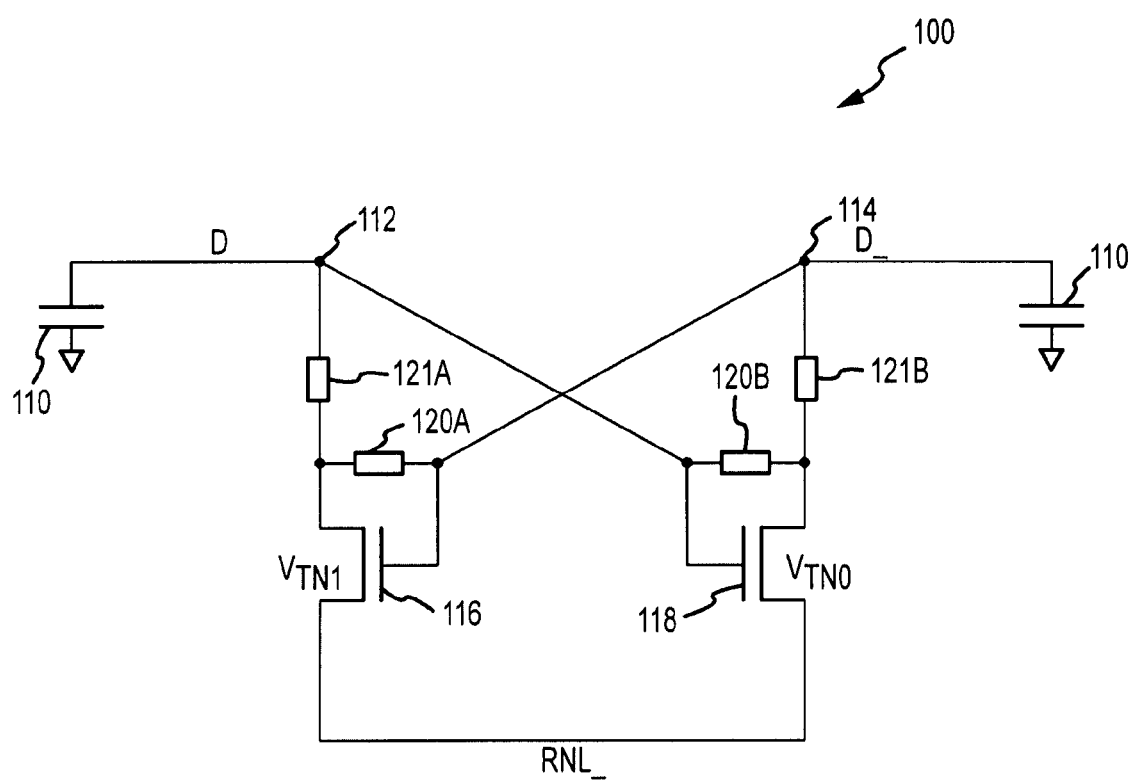
FIG. 1 is a schematic of a portion of a prior art sense amplifier.
Figure 2:
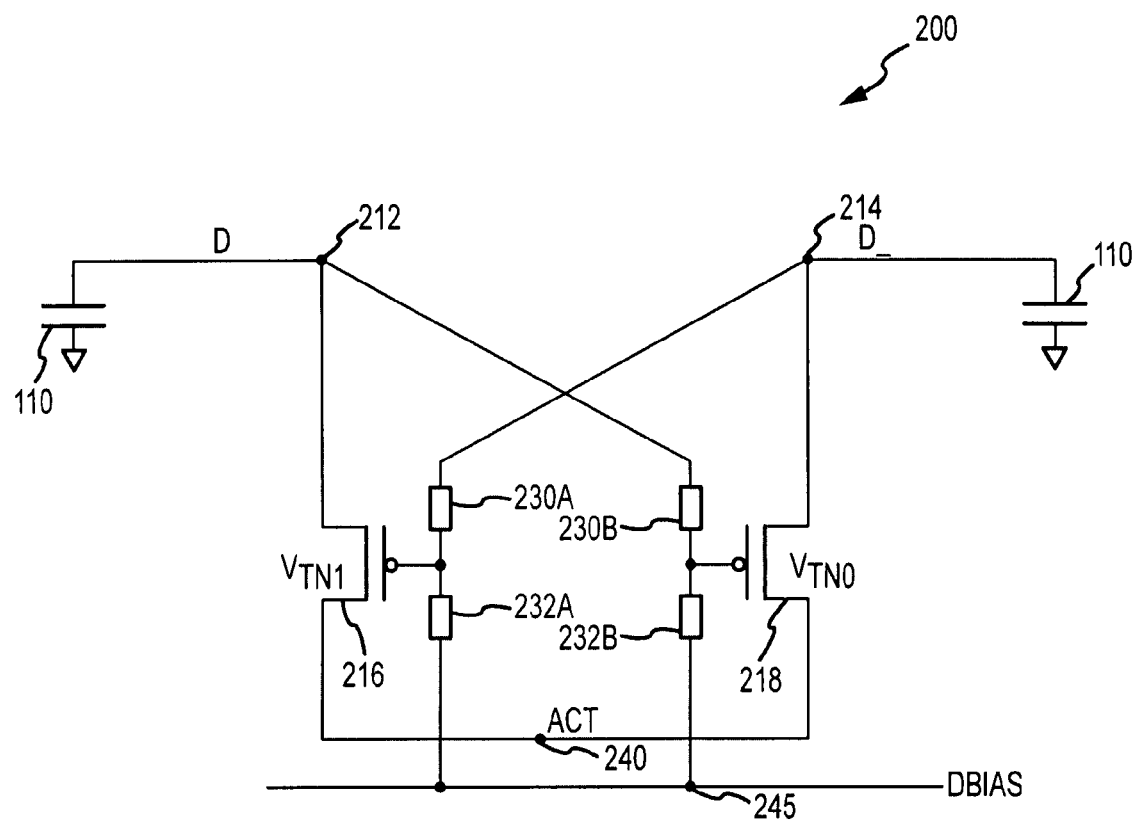
FIG. 2 is a schematic of a PMOS portion of a sense amplifier according to an embodiment of the invention.

A portion of a threshold voltage difference compensated sense amplifier 200 is shown in FIG. 2 according to embodiments of the invention. Similar to the sense amplifier 100 of FIG. 1, the sense amplifier 200 is shown with digit lines D and D_ that may be complementary with respect to each other coupled to sense nodes 212, 214, respectively. The digit line D is coupled to the drain terminal of a PMOS transistor 216 at the sense node 212, and the digit line D_ is coupled to the drain terminal of a PMOS transistor 218 at the sense node 214. The source terminals of the transistors 216, 218 are coupled to each other at a common node 240 to which an activation signal ACT is applied. Gates of the transistors 216, 218 may be coupled to a bias node 245, that receives a negative (or ground) DBIAS signal, through switches 232A,B. The gates of the transistors 218, 216 may additionally be cross-coupled to respective nodes 212, 214 through switches 230A,B, respectively. The switches 230A,B, 232A,B may be controlled by corresponding enable signals that are generated according to whether the sense amplifier 200 is operating in the precharge mode or sense operation mode. The switches 230A,B may be controlled by a CISW signal and the switches 232A,B may be controlled by a DISW signal. The transistors 216, 218 may be cross-coupled to the digit lines and placed in a normal latch configuration by controlling the switches 230A,B using the CISW signal. Note that in sense amplifier 200 there is not a switch coupled on the sensing path. The gates of the transistors 216, 218 may be cross-coupled to the digit lines at sense nodes 212, 214 during a normal sensing operation or to the DBIAS signal at node 245 during a precharge period, as will be further described. In an alternative embodiment, the gates of the transistors 216, 218 are coupled through switches to the common node 240 instead of the bias node 245 to provide diode coupling of the transistors 216, 218 during threshold voltage difference compensation.

Figure 3:
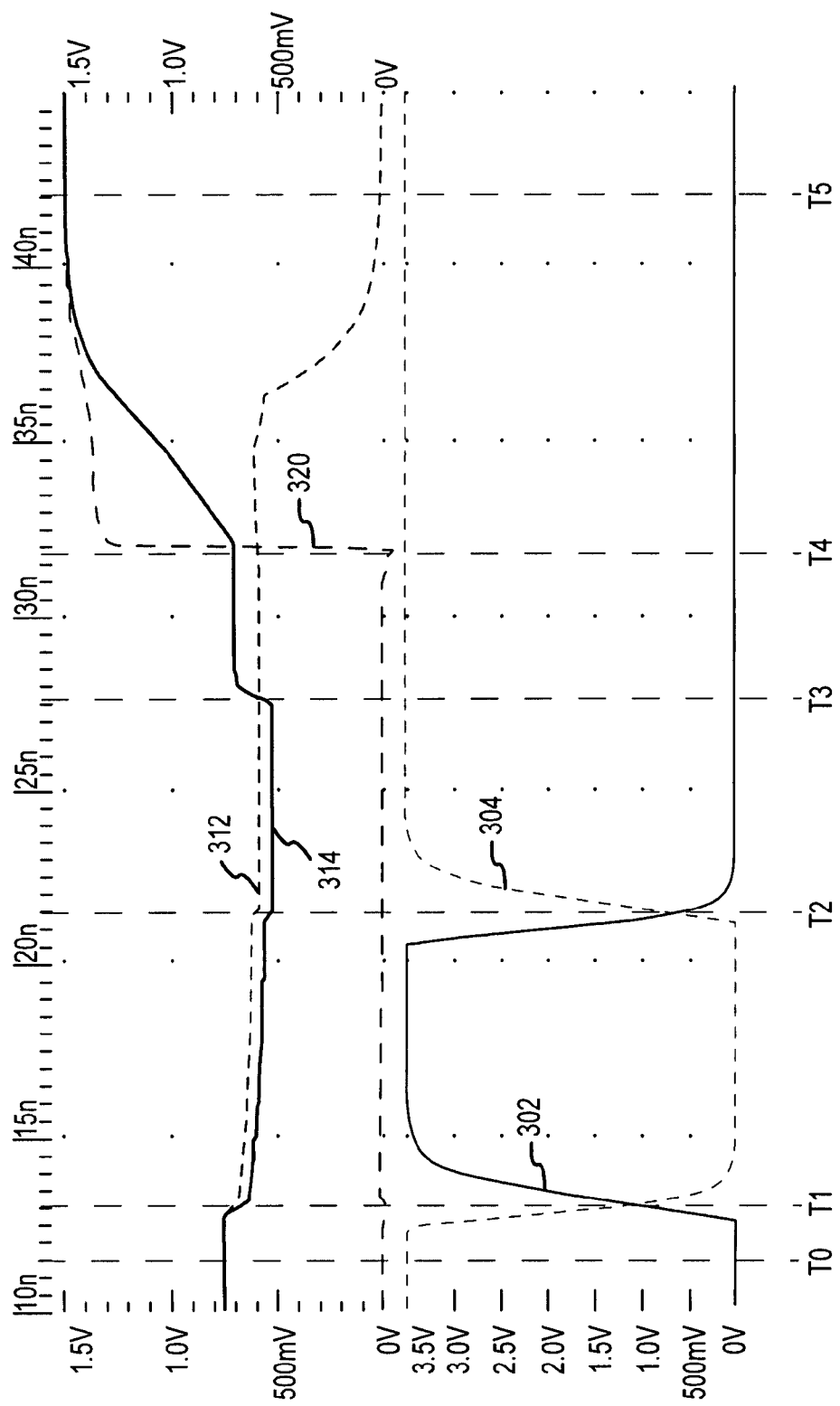
FIG. 3 is signal diagram showing various signals of the sense amplifier in FIG. 2.

The operation of the sense amplifier 200 of FIG. 2 may be summarized according to one example shown as a signal diagram 300 in FIG. 3. During a precharge period, starting at time T0, the sense amplifier 200 is initially placed in a normal cross-coupled configuration, by enabling the switches 230A, B, indicated by the CISW signal 304 being high, and disabling the switches 232A,B, indicated by the DISW signal 302 being low. The sense amplifier 200 precharges and equilibrates the sense nodes 212, 214 to a precharge voltage, such as to $V_{cc}/2$, shown as signals 312, 314 at $V_{cc}/2$. A signal 320 applied to the ACT node 240 is initially at ground at time T0.

Assuming the threshold voltage of the transistor 218 has a magnitude $V_{TN0}$ and the threshold voltage of the transistor 216 has a magnitude $V_{TN1}$, any mismatch between the magnitude of $V_{TN0}$ and $V_{TN1}$ may be compensated by offsetting the voltages of the sense nodes 212, 214 from the precharge voltage $V_{cc}/2$ to provide a voltage differential equal to $V_{TN1}-V_{TN0}$. Therefore, at time T1, the switches 230A,B are disabled by the CISW signal 304 going low and the switches 232A,B are enabled by the high DISW signal 302 such that the gates of the transistors 216, 218 are coupled to DBIAS at node 245. Although not shown in FIG. 3, the DBIAS signal can be set to either zero volts or to a negative voltage. In response, the voltage at sense nodes 212, 214, shown as signals 312, 314 in the signal diagram 300, are offset from $V_{cc}/2$ to $V_{TN1}$ and $V_{TN0}$, respectively. The voltage at sense node 212 is offset to $V_{TN1}$ due to the voltage across the transistor 216 coupled to the node 212, and the voltage at sense node 214 is offset to $V_{TN0}$ due to the voltage across the transistor 218 coupled to node 214. The signals 312, 314 after time T1 show a deviation occurring relative to one another due to a voltage offset between $V_{TN0}$ and $V_{TN1}$. At time T2, after nodes 212, 214 have been respectively offset to $V_{TN1}$ and $V_{TN0}$ the switches 232A,B are subsequently disabled by the DISW signal 302 going low and the switches 230A,B are enabled by a high CISW signal 304 to return the sense amplifier 200 to a normal latch configuration prior to a sensing operation. As a result, the transistors 216, 218 are turned OFF and the sense amplifier 200 is precharged, with the threshold voltage difference between transistors 216, 218 being compensated by the voltage differential between nodes 212, 214, and ready for sensing to occur.

At time T3, a memory cell is accessed and digit lines D and D_ are coupled to the sense nodes 212, 214, respectively. As a result, the voltage of the sense node 214 increases slightly. In the present example, the memory cell is storing charge, which causes the voltage of the sense node 214 to increase when accessed. The ACT signal 320 is driven to $V_{cc}$ at time T4 so that voltage differential between the sense node signals 312 and 314 is sensed and amplified, as shown in FIG. 3 by the voltage differential between signals 312 and 314 increasing after time T4. Not previously discussed, a NMOS sense amplifier stage also coupled to the nodes sense 212, 214 is activated after time T4 to pull the voltage of the sense node signal 212 (represented by signal 312) to ground. At time T5, the sensing operation is complete and the voltage differential between nodes 212, 214 is fully amplified.

As illustrated in FIG. 2 and previously described, the serial cascade connection of switches in a threshold voltage difference compensated sense amplifier of the prior art arrangement can be eliminated in embodiments of the present invention, such as in sense amplifier 200. As a result, effects of mismatch between the switch components on the digit lines can be avoided and the performance of the sense amplifier 200 may be improved. It will be appreciated that although the previously described embodiment is described with respect to the sense amplifier 200 which includes cross-coupled PMOS transistors and the ACT activation node 240, embodiments of the present invention can also be applied to an NMOS sense amplifier stage as well, where applicable, without departing from the scope of the embodiments of the present invention. Those ordinarily skilled in the art will obtain sufficient understanding from the description provided herein to make such modifications as needed to practice embodiments of the present invention as applied to an NMOS sense amplifier stage of a sense amplifier. It will be further appreciated that the specific number and type of switch connections or transistors previously described are not intended to limit the invention to any particular embodiment. Those ordinarily skilled in the art will appreciate that the number and type of switches or transistors are details that can be modified without departing from the scope of the embodiments of the present invention.

Figure 4:
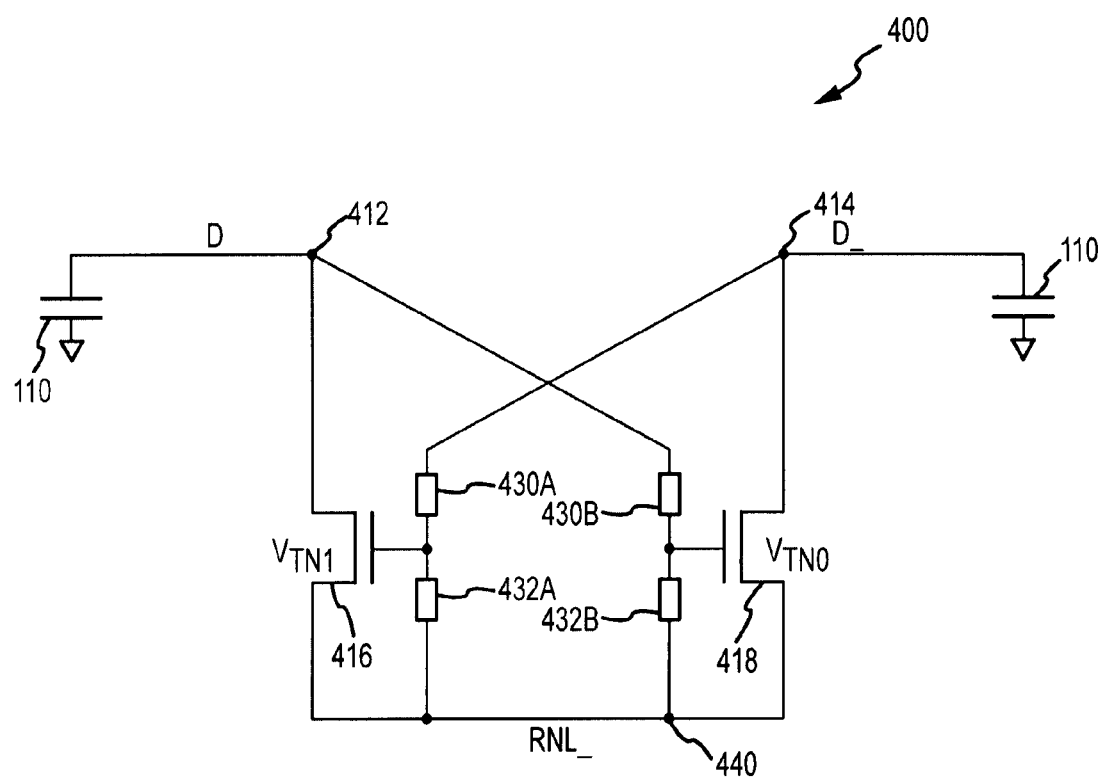
FIG. 4 is a schematic of an NMOS portion of a sense amplifier according to an embodiment of the invention

FIG. 4 shows another embodiment of a threshold voltage compensated sense amplifier 400, which has a pair of transistors 416, 418 that may be configured as a normal latch or as a diode-coupled pair. The transistors 416, 418 in the example of FIG. 4, are NMOS transistors having source terminals coupled to a common node 440 to which an RNL_ activation signal is applied. Similar to the sense amplifier 200 of FIG. 2, the gates of the NMOS transistors 416, 418 may be cross-coupled to digit line nodes 414, 412, through switches 430A, B. The gates of the transistors 416, 418 can be coupled to the RNL_ node 440 in a diode configuration through switches 432A,B.

The operation of the sense amplifier 400 is similar to the operation of the sense amplifier 200, in that during the precharge period and after the digit lines and the RNL_ node 440 have been precharged and equilibrated, the switches 430A,B are disabled and the switches 432A,B are enabled to diode-couple the transistors 416, 418. The RNL_ node is subsequently pulled up towards $V_{CC}$ such that the transistors 416, 418 are turned on for a brief period of time. Assuming the threshold voltage of the transistor 416 is $V_{TN1}$ and the threshold voltage of the transistor 418 is $V_{TN0}$, the voltage at the node 412 is set to $V_{CC}-V_{TN1}$ and the voltage at the digit line node 414 is set to $V_{CC}-V_{TN0}$ due to the transistors 416, 418 being conductive and diode-coupled through the switches 432A,B. As a result, the voltage differential between the nodes 412, 414 is equal to $V_{TN1}-V_{TN0}$ before a sensing operation, which provides compensation for any threshold voltage difference between the transistors 416, 418. The RNL_ node 440 is subsequently pulled to ground or a negative voltage to turn off the transistors 416, 418, and the switches 432A,B are disabled while the switches 430A,B are enabled to place the sense amplifier 400 in the normal latch configuration before sensing occurs.

It will be appreciated that although the previously described embodiment refers to the portion of the sense amplifier 400 that includes NMOS transistors 416, 418 and the RNL_ activation node 440, embodiments of the invention can be modified to include PMOS transistors as well, where applicable, without departing from the scope of the embodiments of the invention. Those ordinarily skilled in the art will obtain sufficient understanding from the description provided herein to make such modifications as needed to practice the embodiments of the sense amplifier 400 as applied to PMOS transistors.

In summary, the sense amplifiers 200, 400 may be configured to compensate for threshold voltage mismatches between transistors without having to place switches 230, 430 or other components in the sensing path between the sense nodes and the transistors of the sense amplifier, thus avoiding negative effects of threshold voltage mismatches that may result from dissimilar switch components.

Figure 5:
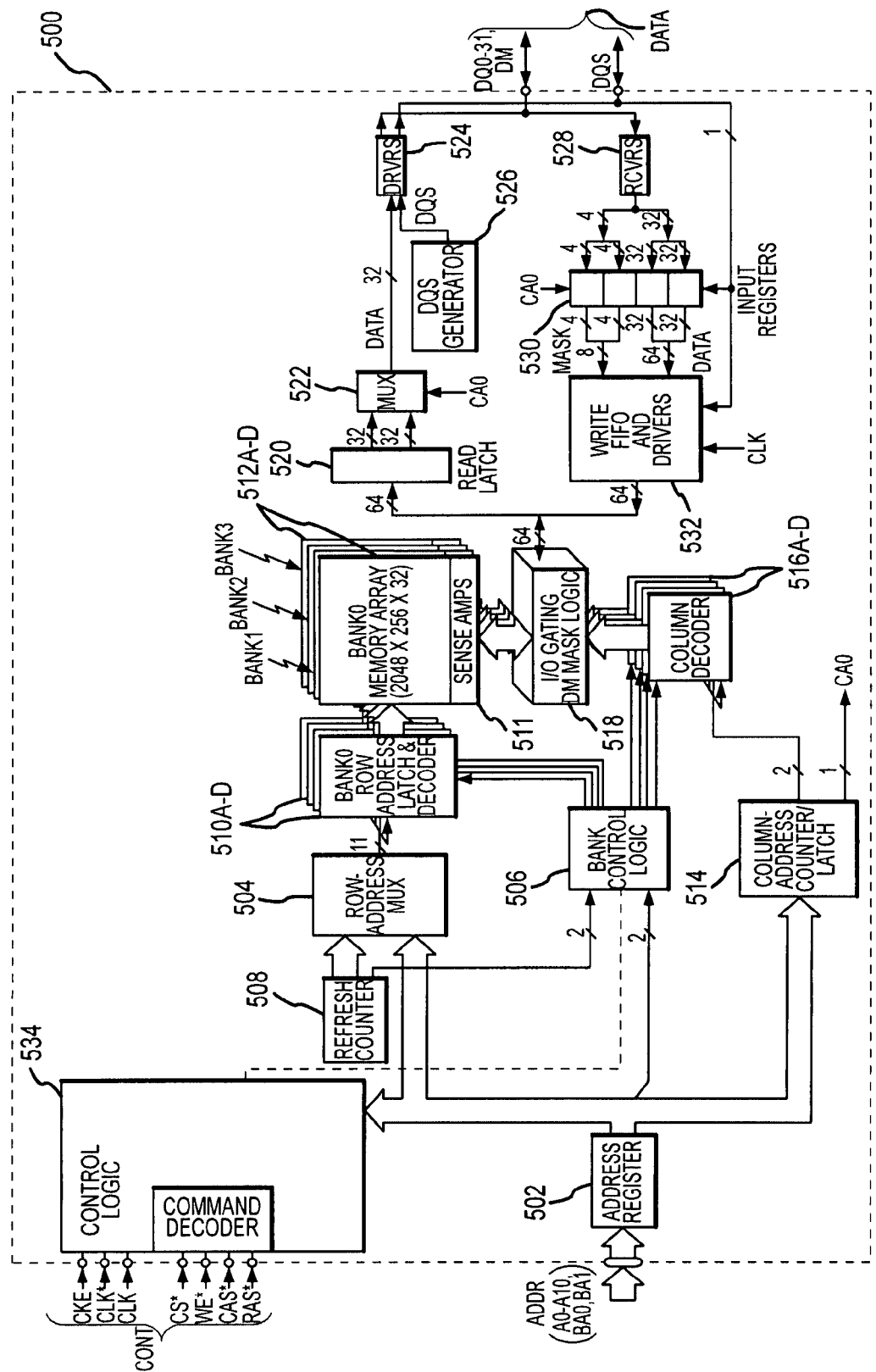
FIG. 5 is a functional block diagram illustrating a memory device that includes the sense amplifier according to embodiments.

FIG. 5 illustrates an embodiment of a memory device 500 including at least one sense amplifier according to embodiments of the invention. The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address.

In response to the decoded row address, the activated row address latch and decoder 510A-D applies various signals to a corresponding memory bank 512A-D, including a row activation signal to activate a row of memory cells corresponding to the decoded row address. Each memory bank 512A-D includes a memory-cell array having a plurality of memory cells arranged in rows and columns. Data stored in the memory cells in the activated row are sensed and amplified by sense amplifiers 511 in the corresponding memory bank. The sense amplifiers 511 are designed according to embodiments of the invention. The row address multiplexer 504 applies the refresh row address from the refresh counter 508 to the decoders 510A-D and the bank control logic circuit 506 uses the refresh bank address from the refresh counter when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. In the embodiment of FIG. 5, the circuit 518 provides 64 bits to the read latch 520 which, in turn, provides two 32 bits words to the multiplexer 522. A data driver 524 sequentially receives the N/2 bit words from the multiplexer 522 and also receives a data strobe signal DQS from a strobe signal generator 526. The DQS signal is used by an external circuit such as a memory controller (not shown) in latching data from the memory device 500 during read operations. The data driver 524 sequentially outputs the received N/2 bits words as a corresponding data word DQ, each data word being output in synchronism with a rising or falling edge of a CLK signal that is applied to clock the memory device 500. The data driver 524 also outputs the data strobe signal DQS having rising and falling edges in synchronism with rising and falling edges of the CLK signal, respectively. Each data word DQ and the data strobe signal DQS collectively define a data bus DATA.

During data write operations, an external circuit such as a memory controller (not shown) applies N/2 bit data words DQ, the strobe signal DQS, and corresponding data masking signals DM on the data bus DATA. A data receiver 528 receives each DQ word and the associated DM signals, and applies these signals to input registers 530 that are clocked by the DQS signal. In response to a rising edge of the DQS signal, the input registers 530 latch a first N/2 bit DQ word and the associated DM signals, and in response to a falling edge of the DQS signal the input registers latch the second N/2 bit DQ word and associated DM signals. The input register 530 provides the two latched N/2 bit DQ words as an N-bit word to a write FIFO and driver 532, which clocks the applied DQ word and DM signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signals CLK, CLK*. The command decoder 534 latches command and address signals at positive edges of the CLK, CLK* signals (i.e., the crossing point of CLK going high and CLK* going low), while the input registers 530 and data drivers 524 transfer data into and from, respectively, the memory device 500 in response the data strobe signal DQS. The detailed operation of the control logic and command decoder 534 in generating the control and timing signals is conventional, and thus, for the sake of brevity, will not be described in more detail. Although previously described with respect to a dynamic random access memory device, embodiments of the present invention can be utilized in applications other than for a memory device where it is desirable to reduce the effects a threshold voltage mismatch when the voltage level of an input signal is amplified.

Figure 6:
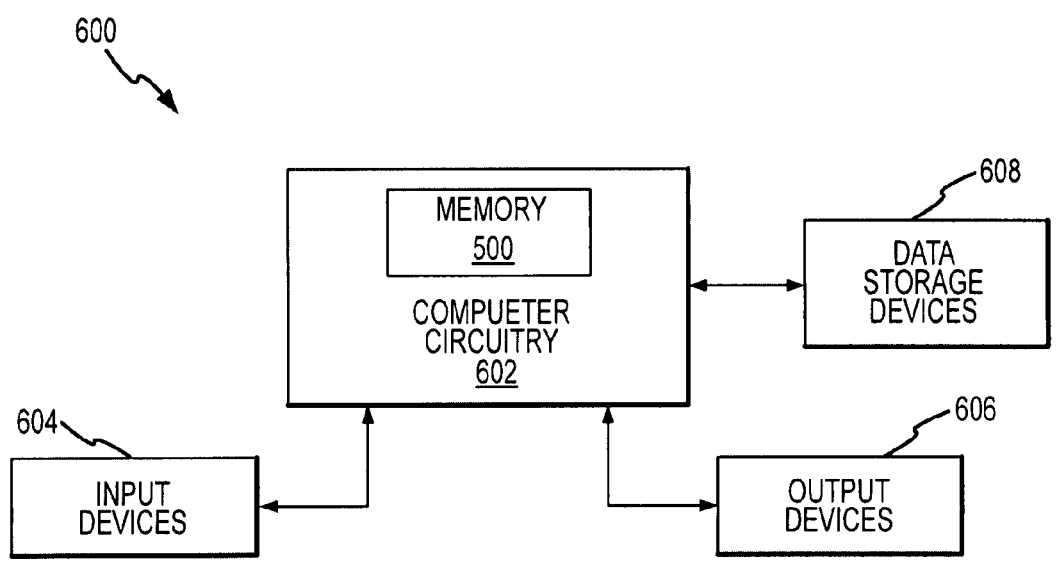
FIG. 6 is a functional block diagram illustrating a computer system including the memory device of FIG. 5.

FIG. 6 is a block diagram of a computer system 600 including computer circuitry 602 including the memory device 500 of FIG. 5. The computer system 600 may include, but is not limited to, portable devices such as cell phones, digital cameras, PDAs and other compact, hand-held devices. Typically, the computer circuitry 602 is coupled through address, data, and control buses to the memory device 500 to provide for writing data to and reading data from the memory device. The computer circuitry 602 includes circuitry for performing various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. The computer system 600 may include one or more output devices 606 coupled to the computer circuitry 602, such as output devices typically including a printer and a video terminal. One or more data storage devices 608 may also be coupled to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, digital video disks (DVDs), and Flash memory and other nonvolatile memory devices.

From the foregoing it will be appreciated that, although specific embodiments of the invention have been described herein for purposes of illustration, various modifications may be made without deviating from the spirit and scope of the invention. Accordingly, embodiments of the invention are not limited except as by the appended claims.

What is claimed is:

1. A sense amplifier comprising:
   a pair of digit line nodes;
   a pair of transistors respectively coupled to the pair of digit line nodes;
   a first pair of switches adapted to cross-couple gates of the transistors to the respective digit line node; and
   a second pair of switches adapted to couple the gates of the transistors to a voltage supply, the first and second pairs of switches adapted to couple the respective gates of the transistors independent of the pair of transistors being respectively coupled to the digit line nodes.

2. The sense amplifier of claim 1 wherein the second pair of switches adapted to couple the gates of the transistors to the voltage supply turns on the pair of transistors responsive to a second enable signal in a manner such that the digit line nodes are set to the respective threshold voltages of the corresponding transistor.

3. The sense amplifier of claim 2 wherein the pair of digit line nodes are charged to compensate for a difference between the threshold voltages of the pair of transistors coupled to the pair of digit lines.

4. The sense amplifier of claim 3 wherein the pair of transistors comprises having drain terminals directly coupled to respective digit line nodes and source terminals coupled to a common node coupled to receive an activation signal.

5. The sense amplifier of claim 4 wherein the voltage supply provides a negative voltage applied to a bias node coupled to the gates of the transistors.

6. The sense amplifier of claim 1 wherein the second pair of switches couple the gates of the transistors to the voltage supply during a precharge period before a sensing operation.

7. The sense amplifier of claim 1 wherein the second pair of switches adapted to couple the gates of the transistors to the voltage supply couple the gates of the transistors in a diode configuration, wherein the source terminals of the pair of transistors is coupled to a negative voltage supply.

8. The sense amplifier of claim 1 wherein the pair of transistors comprises having drain terminals coupled to respective digit line nodes without having a switch between each of the drain terminals and the respective digit line node.

9. A sense amplifier comprising:
   a first node and a second node;
   a first transistor coupled to the first node and a second transistor coupled to the second node;
   a first switch circuit configured to couple the gates of the first and second transistors to a voltage supply, the first switch circuit operable in a first mode of operation to enable the first and second nodes to be set to the respective threshold voltages of the first and second transistors; and
   a second switch circuit configured to cross-couple the gates of the first and second transistors to respective first and second nodes, the second switch circuit operable in a second mode of operation to enable the detection of a differential voltage between the first and second nodes.

10. The sense amplifier of claim 9 wherein the first switch circuit is operable to couple the first and second transistors to the voltage supply responsive to receiving a first switch enable signal.

11. The sense amplifier of claim 10 wherein the pair of transistors comprises having drain terminals directly coupled to the respective first and second nodes, and source terminals coupled to the gate terminals in a diode-configuration, wherein the source terminals are further coupled to receive an activation signal from the voltage supply.

12. The sense amplifier of claim 11 wherein the first mode of operation comprises a precharge period and the second mode of operation comprises a digit line sensing operation.

13. The sense amplifier of claim 12 wherein the activation signal is coupled to Vcc during the precharge period and ground during the digit line sensing operation.

14. The sense amplifier of claim 9 wherein the second switch circuit is operable to cross-couple the gates of the first and second transistors to respective first and second nodes responsive to receiving a second switch enable signal.

15. A method of sensing a differential voltage in a sense amplifier, the method comprising:
in response to a first enable signal, setting a first sensing node to a first voltage through a first input terminal and setting a second sensing node to a second voltage through a second input terminal;
in response to a second enable signal, cross-coupling a voltage supply to the second sensing node through the first input terminal and the voltage supply to the first sensing node through the second input terminal, the first and second sensing nodes having an offset corresponding to the difference between the first and second voltages; and
sensing a change in voltage on either the first or second sensing nodes.

16. The method of claim 15 wherein the first enable signal is generated in a precharge operation mode and the second enable signal is generated in a sensing operation mode.

17. The method of claim 16 further comprising coupling the voltage supply to a common node shared by the first and second input terminals to charge the respective sensing nodes.

18. The method of claim 17 wherein the first input signal is the gate to a first transistor and the second input signal is the gate to a second transistor, and the first sensing node is set to the threshold voltage of the first transistor and the second sensing node is set to the threshold voltage of the second transistor during the precharge operation mode.

19. The method of claim 18 wherein the drain of the first transistor is directly coupled to the second sensing node without a switch between the drain and the second sensing node, and wherein the drain of the second transistor is directly coupled to the first sensing node without a switch between the drain the first sensing node.

20. A method of sensing a change in a differential voltage between a first digit line and a second digit line, the method comprising:
enabling a pair of input nodes to be coupled to a bias signal in a first mode of operation;
charging a first digit line node to a first voltage level and a second digit line node to a second voltage level responsive to the pair of input nodes receiving the bias signal, the differential voltage between the first and second digit line nodes corresponding to the differential voltage between the first and second voltage levels;
enabling the pair of input nodes to be cross-coupled to respective first and second digit line nodes in a second mode of operation; and
detecting the change in the differential voltage between the first and second digit lines responsive to at least one of the pair of input nodes detecting the change in the differential voltage.

21. The method of claim 20 wherein the first mode of operation comprises a precharge period and the second mode of operation comprises a digit line sensing period.

22. The method of claim 20 wherein the first voltage level and the second voltage level comprise the threshold voltages of a respective pair of transistor, and wherein the differential voltage is indicative of an offset generated by the threshold voltage differences between the pair of transistors.

23. The method of claim 22 wherein enabling the pair of input nodes to be coupled to the bias signal comprises diode-coupling the respective pair of transistors to a voltage supply.

24. The method of claim 20 wherein detecting the change in the differential voltage between the first and second digit lines comprises amplifying the change in the differential voltage.

25. A method of precharging a sense amplifier, the method comprising:
setting a first sense node to a voltage based on a threshold voltage of a first transistor having a drain coupled directly to the first node and setting the second node to a voltage based on a threshold voltage of a second transistor having a drain coupled directly to the second node, the first and second nodes offset to the differential voltage between the first and second threshold voltages.

* * * * *

UNITED STATES PATENT AND TRADEMARK OFFICE
CERTIFICATE OF CORRECTION

PATENT NO. : 7,826,293 B2  
APPLICATION NO. : 11/986333  
DATED : November 2, 2010  
INVENTOR(S) : Tae Kim et al.

Page 1 of 1

It is certified that error appears in the above-identified patent and that said Letters Patent is hereby corrected as shown below:

In column 10, line 3, in claim 19, after "drain" insert -- and --.

Signed and Sealed this
Eighteenth Day of January, 2011

David J. Kappos
*Director of the United States Patent and Trademark Office*